United States Patent [19]
Oka et al.

[11] Patent Number: 5,663,917
[45] Date of Patent: Sep. 2, 1997

[54] SEMICONDUCTOR CIRCUIT HAVING MOS CIRCUIT FOR USE IN STRONG ELECTRIC FIELD

[75] Inventors: Tomoharu Oka; Hirohiko Mochizuki; Yasuhiro Fujii; Makoto Yanagisawa, all of Kawasaki, Japan

[73] Assignee: Fujitsu Limited, Kawasaki, Japan

[21] Appl. No.: 510,862

[22] Filed: Aug. 3, 1995

[30] Foreign Application Priority Data

Nov. 15, 1994 [JP] Japan ................... 6-280593

[51] Int. Cl.⁶ .................. G11C 8/00; H03K 5/00
[52] U.S. Cl. .............. 365/226; 365/230.06; 327/530
[58] Field of Search ..................... 365/226, 230.06, 365/230.08, 185.23; 327/530

[56] References Cited

U.S. PATENT DOCUMENTS 5,327,026  7/1994  Hardee et al. .................. 326/88

*Primary Examiner*—David C. Nelms
*Assistant Examiner*—Trong Quang Phan
*Attorney, Agent, or Firm*—Armstrong, Westerman, Hattori, McLeland & Naughton

[57] ABSTRACT

A semiconductor circuit has a first transistor, a second transistor, a third transistor, and a fourth transistor. The first and fourth transistors are a first conduction type, and the second and third transistors are a second conduction type opposite to the first conduction type. The semiconductor circuit employs a first power supply line for supplying a first voltage, a second power supply line for supplying a second voltage, and a third power supply line for supplying a third voltage outside of the range determined by the first voltage and the second voltage. The first, second, and third transistors are connected in series between the second power supply line and the third power supply line, and the fourth transistor is connected between an input terminal and a control electrode of the first transistor.

26 Claims, 4 Drawing Sheets

SEMICONDUCTOR CIRCUIT HAVING MOS CIRCUIT FOR USE IN STRONG ELECTRIC FIELD

BACKGROUND OF THE INVENTION

1. Field of the Invention

The present invention relates to a semiconductor circuit, and more particularly, to a semiconductor circuit having a MOS circuit for use in a strong electric field.

2. Description of the Related Art

Recently, in semiconductor memories (for example, dynamic random access memories: DRAMs), dense integration and a low power consumption have been strongly required. Namely, a size of each transistor included in the DRAMs must be miniaturized and a driving voltage thereof must be lowered (for example, a power supply voltage VCC of 3.3 volts), and thus the gate oxide film of the transistor (MOS transistor) must be thinly formed.

By the way, in recent years, there has been provided a pre-word decoder for a DRAM which is driven by a high power supply voltage (normal high power supply voltage: VCC=3.3 volts) and a super high power supply voltage (SVC=VCC+1=4.3 volts) higher than the normal high power supply voltage. In such a semiconductor circuit (pre-word decoder), the gate oxide film of the MOS transistor becomes deteriorated by using the super high power supply voltage. The problems of the prior art will be explained hereinafter in detail with reference to the accompanying drawings.

SUMMARY OF THE INVENTION

An object of the present invention is to provide a semiconductor circuit that can prevent the deterioration of a gate oxide film of a MOS transistor included in the semiconductor circuit, even when employing a super high power supply voltage higher than a normal high power supply voltage.

According to the present invention, there is provided a semiconductor circuit employing a first power supply line for supplying a first voltage, a second power supply line for supplying a second voltage, and a third power supply line for supplying a third voltage outside a range determined by the first voltage and the second voltage, wherein the semiconductor circuit comprises a first transistor of a first conduction type; a second transistor of a second conduction type opposite to the first conduction type; a third transistor of the second conduction type, the first, second, and third transistors being connected in series between the second power supply line and the third power supply line; and a fourth transistor of the first conduction type, connected between an input terminal and a control electrode of the first transistor.

The semiconductor circuit may further comprise a fifth transistor of the second conduction type, connected between the input terminal and a control electrode of the second transistor. The voltage of the first power supply line may be applied to control electrodes of the third and fifth transistors.

The semiconductor circuit may further comprise a sixth transistor of the first conduction type, connected between the first transistor and the third transistor, and a specific voltage is applied to control electrodes of the fourth and sixth transistors. The specific voltage applied to the control electrodes of the fourth and sixth transistors may be determined to be a voltage lower than twice the threshold voltage of the fourth transistor. Each transistor of the first conduction type may be determined to be a P-channel type MOS transistor, and each transistor of the second conduction type may be determined to be an N-channel type MOS transistor.

The semiconductor circuit may be applied to a pre-word decoder of a semiconductor memory, and word lines of the semiconductor memory may be controlled by the semiconductor circuit. The first voltage may be a normal high power supply voltage, the second voltage may be a low power supply voltage, and the third voltage may be a super high power supply voltage higher than the normal high power supply voltage.

Further, according to the present invention, there is provided a semiconductor circuit employing a first power supply voltage, a second power supply voltage, and a third power supply voltage outside a range determined by the first power supply voltage and second power supply voltage, wherein the semiconductor circuit comprises a first transistor of a first conduction type, and a strong electric field caused by the second power supply voltage and the third power supply voltage is applied to the first transistor; and a second transistor of the first conduction type, the second transistor being inserted between an input terminal and a control electrode of the first transistor, and a control electrode of the second transistor being set at a voltage determined by subtracting twice the threshold voltage of the first and second transistors from the first power supply voltage or set at a voltage lower than the determined voltage.

The first and second transistors of the first conduction type may be determined to be P-channel type MOS transistors. The semiconductor circuit may further comprise a third transistor of a second conduction type opposite to the first conduction type, and a strong electric field caused by the second power supply voltage and the third power supply voltage is applied to the third transistor; and a fourth transistor of the second conduction type, the fourth transistor being inserted between an input terminal and a control electrode of the third transistor, and a control electrode of the fourth transistor being set at the first power supply voltage or lower.

The third and fourth transistors of the second conduction type may be determined to be N-channel type MOS transistors. The semiconductor circuit may be applied to a pre-word decoder of a semiconductor memory, and word lines of the semiconductor memory may be controlled by the semiconductor circuit. The first power supply voltage may be a normal high power supply voltage, the second power supply voltage may be a low power supply voltage, and the third power supply voltage may be a super high power supply voltage higher than the normal high power supply voltage.

According to the present invention, there is also provided a semiconductor memory having a plurality of word lines, a plurality of bit lines, a plurality of memory cells each positioned at an intersection portion between a word line and a bit line, a column decoder for selecting a bit line, a word decoder for selecting a word line, and a pre-word decoder receiving address signals and controlling the word decoder, the pre-word decoder employing a first power supply line for supplying a first voltage, a second power supply line for supplying a second voltage, and a third power supply line for supplying a third voltage which is outside a range determined by the first voltage and the second voltage, wherein the pre-word decoder comprises a first transistor of a first conduction type; a second transistor of a second conduction type opposite to the first conduction type; a third transistor of the second conduction type, the first, second, and third transistors being connected in series between the second power supply line and the third power supply line; a fourth transistor of the first conduction type, connected between an input terminal and a control electrode of the first transistor.

In addition, according to the present invention, there is provided a semiconductor memory having a plurality of word lines, a plurality of bit lines, a plurality of memory cells each positioned at an intersection portion between a word line and a bit line, a column decoder for selecting a bit line, a word decoder for selecting a word line, and a pre-word decoder receiving address signals and controlling the word decoder, the pre-word decoder employing a first power supply voltage, a second power supply voltage, and a third power supply voltage which is outside a range determined by the first power supply voltage and second power supply voltage, wherein the pre-word decoder comprises a first transistor of a first conduction type, and a strong electric field caused by the second power supply voltage and the third power supply voltage being applied to the first transistor; and a second transistor of the first conduction type, the second transistor being inserted between an input terminal and a control electrode of the first transistor, and a control electrode of the second transistor being set at a voltage determined by subtracting twice the threshold voltage of the first and second transistors from the first power supply voltage or set at a voltage lower than the determined voltage.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

For a better understanding of the present invention, the problems in the prior art will be explained with reference to the accompanying drawings.

Figure 1:
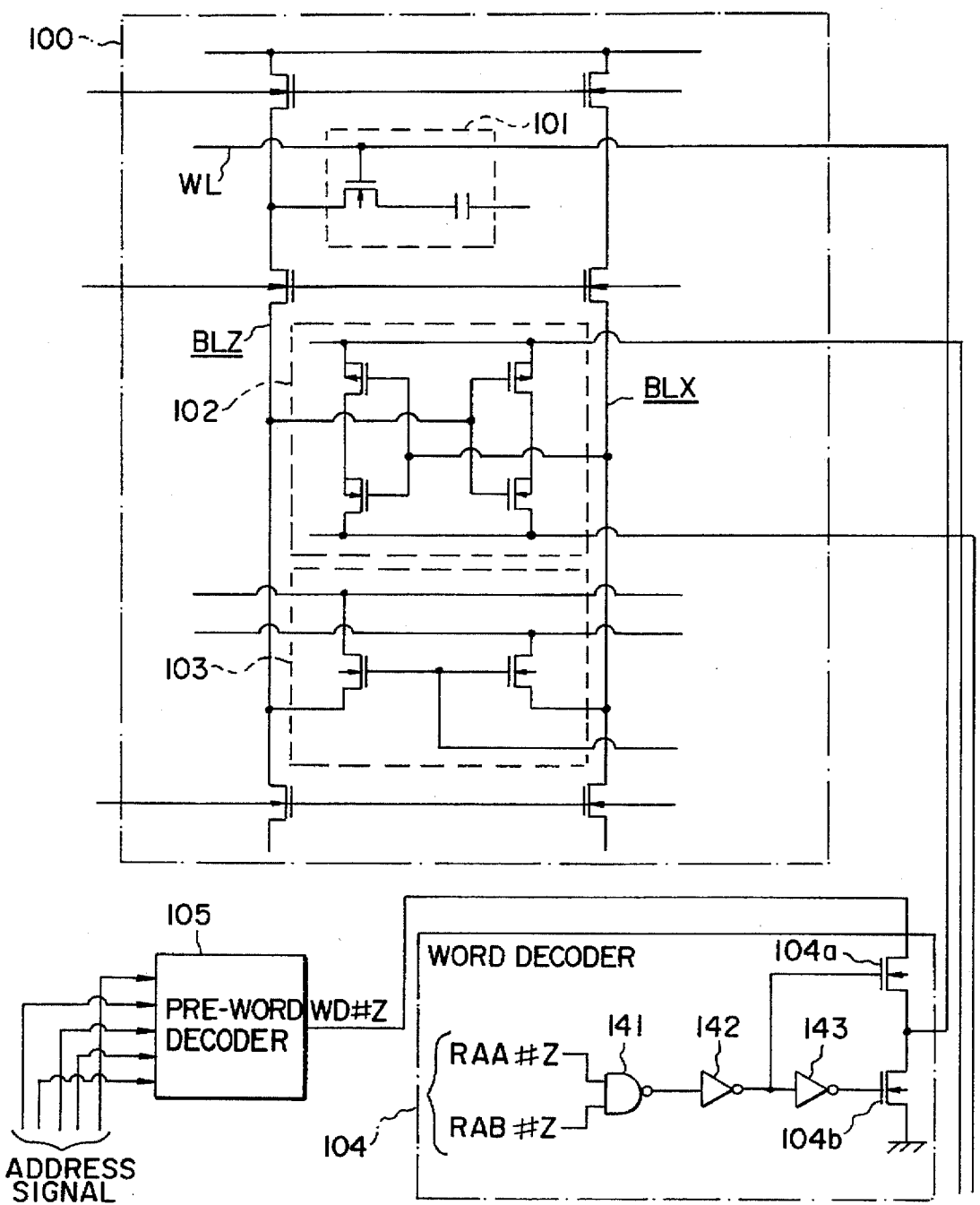
FIG. 1 is a block diagram showing a whole configuration of a semiconductor memory.

FIG. 1 shows a whole configuration of a semiconductor memory (DRAM). In FIG. 1, reference numeral 100 denotes a memory cell array, 101 denotes a memory cell having a memory cell transistor and a capacitor, 102 denotes a sense amplifier, 103 denotes a column decoder, 104 denotes a word decoder, and 105 denotes a pre-word decoder. Further, references BLX and BLZ denote bit lines (complementary pair of bit lines), and WL denotes a word line, for supplying a word line selection signal. Note that, in FIG. 1, only one word line (WL), one pair of bit lines (BLX, BLZ), and one memory cell 101 are described, but a plurality of word lines, a plural pairs of bit lines, and a plurality of memory cells (101) each positioned at an intersection portion between the word line (WL) and the pair of bit lines (BLX, BLZ) are provided in practice.

Namely, the semiconductor memory comprises a plurality of word lines WL, a plurality of bit lines BLX, BLZ, a plurality of memory cells 101 each positioned at an intersection portion between a word line WL and a bit line (BLX, BLZ), a column decoder 103 for selecting a bit line, a word decoder 104 for selecting a word line, and a pre-word decoder 105 receiving address signals and controlling the word decoder 104.

As shown in FIG. 1, the word decoder 104 includes a NAND gate 141, inverters 142, 143, and N-channel type MOS transistors 104a, 104b. The word decoder 104 receives address signals RAA#Z and RAB#Z, and controls switching operations of the transistors 104a and 104b.

The column decoder 103 is used to select a pair of bit lines BLX, BLZ, and the word decoder 104 is used to select a word line WL, and a pre-word decoder 105 receives the address signals and is used to control the word decoder 104. Namely, the pre-word decoder 105 outputs a signal (WD#Z) to the word decoder 104 and the signal WD#Z is supplied to the word line WL as the word line selection signal WLS through the transistor 104a of the word decoder 104. Note that the configuration of the semiconductor memory can be variously modified, and a semiconductor circuit according to the present invention can be applied to various semiconductor memories or various semiconductor circuits.

Figure 2:
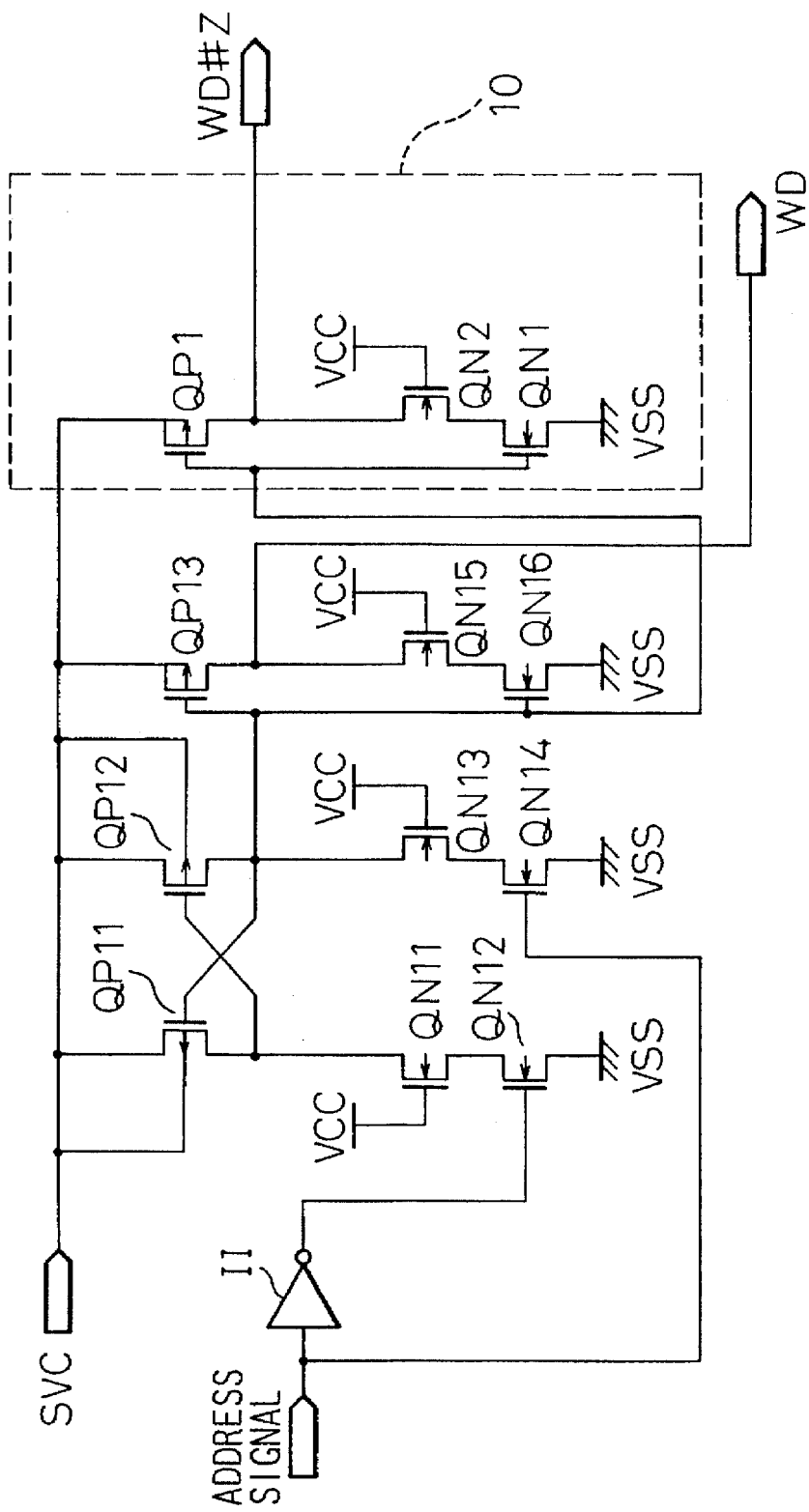
FIG. 2 is circuit diagram showing an example of a pre-word decoder in a semiconductor memory according to the prior art.

FIG. 2 shows an example of a pre-word decoder in a semiconductor memory according to the prior art. In FIG. 2, reference VCC denotes a high power supply voltage (normal high power supply voltage: for example, VCC=3.3 volts), VSS denotes a low power supply voltage (ground voltage: for example, VSS=0 volts), and SVC denotes a super high power supply voltage (for example, SVC=4.3 volts).

As shown in FIG. 2, the pre-word decoder 105 comprises an inverter II, P-channel type MOS transistors QP11 to QP13 and QP1 and N-channel type MOS transistors QN11 to QN16 and QN1 and QN2. In FIG. 2, a reference numeral 10 denotes an output circuit of the pre-word decoder 105 for outputting a signal WD#Z. The super high power supply voltage SVC is applied to the source electrodes of the transistors QP11, QP12, QP13, and QP1, and the normal high power supply voltage VCC is applied to gate electrodes of the transistors QN11, QN13, QN15, and QN2.

Figure 3:
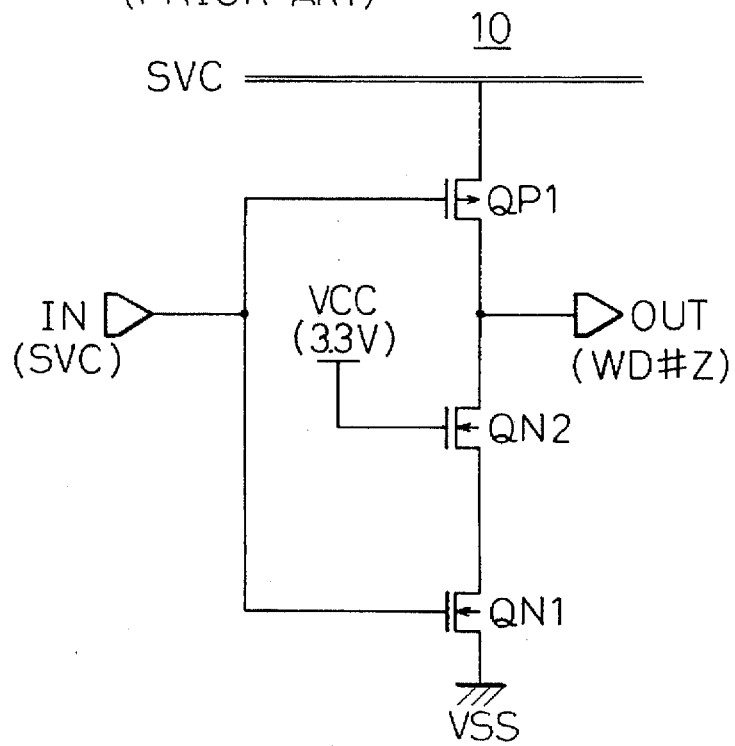
FIG. 3 is a circuit diagram showing an example of a semiconductor circuit of the prior art corresponding to that of the present invention.

FIG. 3 shows an example of a semiconductor circuit of the prior art corresponding to that of the present invention, and more particularly, shows the output circuit 10 of the pre-word decoder 105 shown in FIG. 2.

As shown in FIG. 3, the output circuit 10 of the pre-word decoder 105 includes the P-channel type MOS transistor QP1 and the N-channel type transistors QN2 and QN1, which are connected in series between the super high power supply means (super high power voltage supplying line) SVC and the low power supply means (low power voltage supplying line) VSS. Namely, a source electrode of the P-channel type MOS transistor QP1 is connected to the super high power supplying line SVC, a drain electrode of the transistor QP1 is connected to an output terminal OUT (WD#Z) of the pre-word decoder 105 (output circuit 10).

The output terminal OUT of the output circuit 10 is connected to a drain electrode of the N-channel type MOS transistor QN2. Further, a source electrode of the transistor QN2 is connected to a drain electrode of the N-channel type MOS transistor QN1, and a source electrode of the transistor QN1 is connected to the low power supplying line VSS.

As shown in FIG. 3, both gate electrodes of the transistors QP1 and QN1 are connected to an input terminal IN of the output circuit 10, and a gate electrode of the transistor QN2 is connected to the normal high power supplying line (normal high power voltage supply voltage) VCC.

Figure 4:
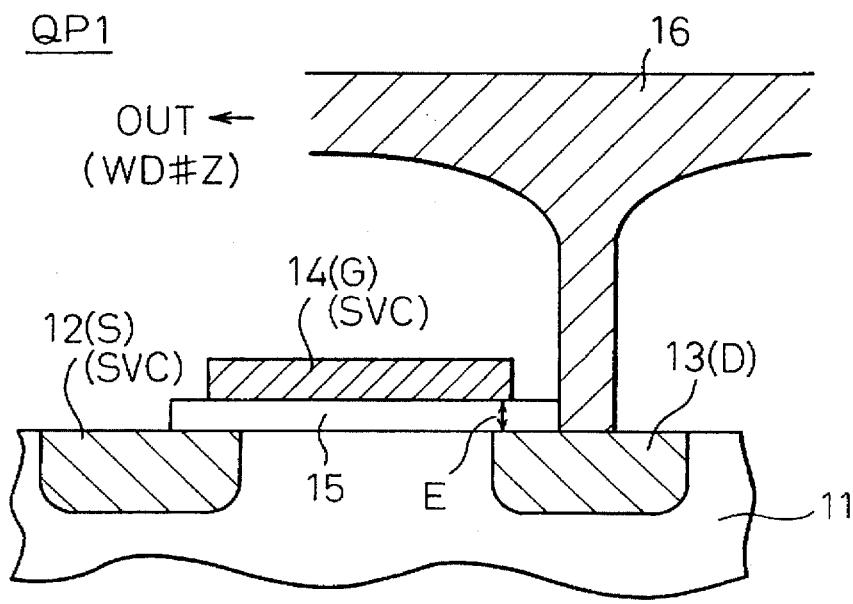
FIG. 4 is a diagram for explaining problems in the semiconductor memory according to the prior art.

FIG. 4 is a diagram for explaining problems in the semiconductor memory according to the prior art. Namely, FIG. 4 shows the P-channel type MOS transistor QP1 in the output circuit 10 shown in FIG. 3. In FIG. 4, reference numeral 11 denotes a semiconductor substrate, 12 denotes a source region (S), 13 denotes a drain region (D), 14 denotes a gate region (G), 15 denotes a gate oxide film, and 16 denotes aluminium wiring.

As shown in FIG. 4, in the transistor QP1 of the output circuit 10 of FIG. 3, a voltage (super high power supply voltage SVC) is applied to the source region (source electrode) 12, and the drain region (drain electrode) 13 is connected to the output terminal OUT of the output circuit 10 through the aluminium wiring 16.

Note that, in the transistor QP1, the super high power supply voltage SVC may be applied to the gate region (gate electrode) 14, where the super high power supply voltage SVC is applied to the gate region 14 and the source region 12 of the transistor QP1. Namely, an electric field E caused by the super high power supply voltage SVC is directly applied to the gate oxide film positioned between the gate region 14 and the drain region 13.

Therefore, the gate oxide film 15 of the MOS transistor (QP1), which is thinly formed in accordance with miniaturizing transistor size and decreasing the driving voltage, becomes deteriorated. Namely, for example, in a pre-word decoder for a semiconductor memory, a super high power supply voltage SVC higher than a normal high power supply voltage VCC is used, and thus a gate oxide film of a MOS transistor may deteriorate by using the super high power supply voltage SVC.

Next, a preferred embodiment of a semiconductor circuit according to the present invention will be explained, with reference to FIG. 5.

Figure 5:
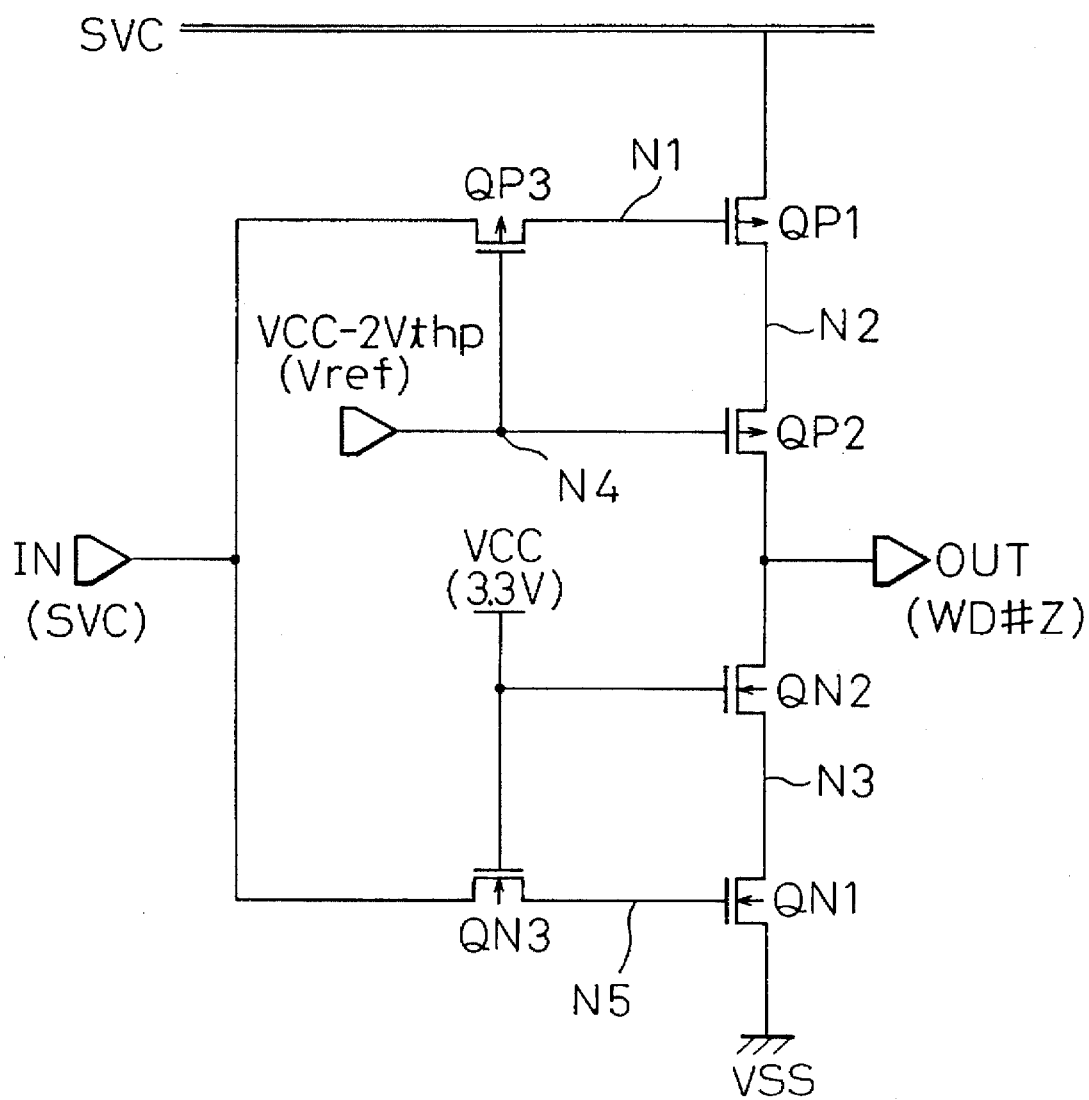
FIG. 5 is a circuit diagram showing an embodiment of a semiconductor circuit according to the present invention.

FIG. 5 shows an embodiment of a semiconductor circuit 1 according to the present invention, and more particularly, FIG. 5 shows an output circuit 1 corresponding to the output 10 of the pre-word decoder 105 in the semiconductor memory shown in FIGS. 1 to 3.

In FIG. 5, reference VCC denotes a high power supply voltage (normal high power supply voltage: for example, VCC=3.3 volts), VSS denotes a low power supply voltage (ground voltage: for example, VSS=0 volts), and SVC denotes a super high power supply voltage (for example, SVC=VCC+1=4.3 volts).

As shown in FIG. 5, the semiconductor circuit (output circuit of the pre-word decoder in a semiconductor memory: with reference to FIGS. 1 to 3) comprises P-channel MOS transistors QP1 to QP3, and N-channel transistors QN1 to QN3. The transistors QP1, QP2, QN2, and QN1 are connected in series between the super high power supply means (super high power voltage supplying line) SVC and the low power supply means (low power voltage supplying line) VSS.

Namely, a source electrode of the P-channel type MOS transistor QP1 is connected to the super high power supplying line SVC, a drain electrode of the transistor QP1 is connected to a source electrode of the P-channel type MOS transistor QP2, and a drain electrode of the transistor QP2 is connected to an output terminal OUT (WD#Z) of the output circuit 1 (pre-word decoder: with reference to FIGS. 1 to 3).

The output terminal OUT of the output circuit 1 is connected to a drain electrode of the N-channel type MOS transistor QN2. Further, a source electrode of the transistor QN2 is connected to a drain electrode of the N-channel type MOS transistor QN1, and a source electrode of the transistor QN1 is connected to the low power supply line VSS.

As shown in FIG. 5, the P-channel MOS transistor QP3 is inserted between a gate electrode of the transistor QP1 and an input terminal IN of the input circuit 1, and gate electrodes of the transistor QP2 and QP3 are connected together, and a signal (for example, reference voltage Vref) is applied to the gate electrodes of the transistor QP2 and QP3. Note that a voltage of the signal applied to the transistor QP2 and QP3 is determined by subtracting twice the threshold voltage (Vthp) of the P-channel MOS transistor (QP1, QP2, QP3) from the normal high power supply voltage (VCC) or set at a voltage lower than the determined voltage, i.e., (VCC−2Vthp) or <(VCC−2Vthp). Further, as described above, the voltage applied to the gate electrodes of the transistors QP2 and QP3 is, for example, an internal reference voltage Vref ($\leq$VCC−2Vthp) of the semiconductor memory (DRAM).

Similarly, the N-channel MOS transistor QN3 is inserted between a gate electrode of the transistor QN1 and the input terminal IN of the input circuit 1, and gate electrodes of the transistor QN2 and QN3 are connected together, and a signal (normal high power supply voltage (VCC)) is applied to these gate electrodes of the transistor QN2 and QN3. Note that the gate electrode of the transistor QN3 can be set at the normal high power supply voltage (VCC) or lower.

As described above, in the embodiment of the semiconductor circuit of the invention shown in FIG. 5, the transistor QP2 is provided between the drain electrode of the transistor QP2 and the output terminal OUT, the transistor QP3 is provided between the gate electrode of the transistor QP1 and the input terminal IN, and the transistor QN3 is provided between the gate electrode of the transistor QN1 and the input terminal IN. Consequently, the strength of the electric field (E) applied to the gate oxide film of the MOS transistor, which is shown in FIG. 4, can be reduced, so that a deterioration of the gate oxide film of the transistor (QP1) can be prevented.

Namely, in the semiconductor circuit shown in FIG. 5, when setting a voltage of the gate electrodes (node N4) of the transistors QP2 and QP3 to VCC−2Vthp and applying the super high power supply voltage SVC to the input terminal IN of the output circuit 1, the transistor QP3 is switched ON and a level of the node N4 is brought to SVC. Further a level of a node N5 is brought to VCC−Vthp, and a node N3 and the output terminal OUT is brought to SVC. In this case, a level of a node N2 is brought to $(VCC-2Vthp)+Vthp=VCC-Vthp.$ Further, when applying the low power supply voltage VSS to the input terminal IN of the output circuit 1, the level at a node N1 is brought to $(VCC-Vthp)+Vthp=VCC-Vthp$, and thus the level of the node N2 is brought to SVC. In this case, the level of the node N5 is brought to VSS, the level of the node N3 is brought to VCC−Vthp, and the level of the output terminal OUT of the output circuit 1 (pre-word decoder) is brought to SVC.

Note that, in the above embodiment of the semiconductor circuit according to the present invention, when the output terminal OUT is at VSS or when it is at SVC, none of the transistors in the semiconductor circuit receives a strong electric field. Namely, in the semiconductor circuit according to the present invention, the super high power supply voltage SVC is not applied between the gate electrode and drain electrode of any transistor in the semiconductor circuit.

Consequently, even when employing a super high power supply voltage (SVC) higher than a normal high power supply voltage (VCC), the deterioration of a gate oxide film of a MOS transistor included in the semiconductor circuit is not caused.

The semiconductor circuit according to the present invention can not only applied to an output circuit of a pre-word decoder of the semiconductor memory shown in FIG. 1, but the semiconductor circuit can also be applied to various semiconductor circuits employing a super high power supply voltage (SVC) higher than a normal high power supply voltage (VCC) or employing a super low power supply voltage lower than a normal low power supply voltage (VSS).

As explained above, the present invention provides a semiconductor circuit that can prevent a deterioration of a gate oxide film of a MOS transistor included in the semiconductor circuit, even when employing a super high power supply voltage higher than a normal high power supply voltage.

Many different embodiments of the present invention may be constructed without departing from the spirit and scope of the present invention, and it should be understood that the present invention is not limited to the specific embodiments described in this specification, except as defined in the appended claims.

What is claimed is:

1. A semiconductor circuit employing a first power supply line for supplying a first voltage, a second power supply line for supplying a second voltage, and a third power supply line for supplying a third voltage outside a range determined by said first voltage and said second voltage, wherein said semiconductor circuit comprises:

a first transistor of a first conduction type;

a second transistor of a second conduction type opposite to said first conduction type;

a third transistor of said second conduction type, said first, second, and third transistors being connected in series between said second power supply line and said third power supply line;

a fourth transistor of said first conduction type, connected between an input terminal and a control electrode of said first transistor.

2. A semiconductor circuit as claimed in claim 1, wherein said semiconductor circuit further comprises a fifth transistor of said second conduction type, connected between said input terminal and a control electrode of said second transistor.

3. A semiconductor circuit as claimed in claim 2, wherein the voltage of said first power supply line is applied to control electrodes of said third and fifth transistors.

4. A semiconductor circuit as claimed in claim 1, wherein said semiconductor circuit further comprises a sixth transistor of said first conduction type, connected between said first transistor and said third transistor, and a specific voltage is applied to the control electrodes of said fourth and sixth transistors.

5. A semiconductor circuit as claimed in claim 4, wherein said specific voltage applied to the control electrodes of said fourth and sixth transistors is determined to be a voltage lower than twice the threshold voltage of said fourth transistor.

6. A semiconductor circuit as claimed in claim 1, wherein each transistor of said first conduction type is determined to be a P-channel type MOS transistor, and each transistor of said second conduction type is determined to be an N-channel type MOS transistor.

7. A semiconductor circuit as claimed in claim 1, wherein said semiconductor circuit is applied to a pre-word decoder of a semiconductor memory, and word lines of said semiconductor memory are controlled by said semiconductor circuit.

8. A semiconductor circuit as claimed in claim 1, wherein said first voltage is a normal high power supply voltage, said second voltage is a low power supply voltage, and said third voltage is a super high power supply voltage higher than said normal high power supply voltage.

9. A semiconductor circuit employing a first power supply voltage, a second power supply voltage, and a third power supply voltage outside a range determined by said first power supply voltage and second power supply voltage, wherein said semiconductor circuit comprises:

a first transistor of a first conduction type, and a strong electric field caused by said second power supply voltage and said third power supply voltage being applied to said first transistor; and a second transistor of said first conduction type, said second transistor being inserted between an input terminal and a control electrode of said first transistor, and a control electrode of said second transistor being set at a voltage determined by subtracting twice the threshold voltage of said first and second transistors from said first power supply voltage or set at a voltage lower than the determined voltage.

10. A semiconductor circuit as claimed in claim 9, wherein said first and second transistors of said first conduction type are determined to P-channel type MOS transistors.

11. A semiconductor circuit as claimed in claim 9, wherein said semiconductor circuit further comprises:

a third transistor of a second conduction type opposite to said first conduction type, and a strong electric field caused by said second power supply voltage and said third power supply voltage being applied to said third transistor; and a fourth transistor of said second conduction type, said fourth transistor being inserted between an input terminal and a control electrode of said third transistor, and a control electrode of said fourth transistor being set at said first power supply voltage or lower.

12. A semiconductor circuit as claimed in claim 11, wherein said third and fourth transistors of said second conduction type are determined to be N-channel type MOS transistors.

13. A semiconductor circuit as claimed in claim 9, wherein said semiconductor circuit is applied to a pre-word decoder of a semiconductor memory, and word lines of said semiconductor memory are controlled by said semiconductor circuit.

14. A semiconductor circuit as claimed in claim 9, wherein said first power supply voltage is a normal high power supply voltage, said second power supply voltage is a low power supply voltage, and said third power supply voltage is a super high power supply voltage higher than said normal high power supply voltage.

15. A semiconductor memory having a plurality of word lines, a plurality of bit lines, a plurality of memory cells each positioned at an intersection portion between a word line and a bit line, a column decoder for selecting a bit line, a word decoder for selecting a word line, and a pre-word decoder receiving address signals and controlling said word decoder, said pre-word decoder employing a first power supply line for supplying a first voltage, a second power supply line for supplying a second voltage, and a third power supply line for supplying a third voltage outside a range determined by said first voltage and said second voltage, wherein said pre-word decoder comprises:

a first transistor of a first conduction type;

a second transistor of a second conduction type opposite to said first conduction type;

a third transistor of said second conduction type, said first, second, and third transistors being connected in series between said second power supply line and said third power supply line;

a fourth transistor of said first conduction type, connected between an input terminal and a control electrode of said first transistor.

16. A semiconductor memory as claimed in claim 15, wherein said pre-word decoder further comprises a fifth transistor of said second conduction type, connected between said input terminal and a control electrode of said second transistor.

17. A semiconductor memory as claimed in claim 16, wherein a voltage of said first power supply line is applied to control electrodes of said third and fifth transistors.

18. A semiconductor memory as claimed in claim 15, wherein said pre-word decoder further comprises a sixth transistor of said first conduction type, connected between said first transistor and said third transistor, and a specific voltage is applied to the control electrodes of said fourth and sixth transistors.

19. A semiconductor memory as claimed in claim 18, wherein said specific voltage applied to the control electrodes of said fourth and sixth transistors is determined to be a voltage lower than twice the threshold voltage of said fourth transistor.

20. A semiconductor memory as claimed in claim 15, wherein each transistor of said first conduction type is determined to be a P-channel type MOS transistor, and each transistor of said second conduction type is determined to be an N-channel type MOS transistor.

21. A semiconductor memory as claimed in claim 15, wherein said first voltage is a normal high power supply voltage, said second voltage is a low power supply voltage, and said third voltage is a super high power supply voltage higher than said normal high power supply voltage.

22. A semiconductor memory having a pre-word decoder employing a first power supply voltage, a second power supply voltage, and a third power supply voltage outside a range determined by said first power supply voltage second power supply voltage, wherein said pre-word decoder comprises:

a first transistor of a first conduction type, a strong electric field caused by said second power supply voltage and said third power supply voltage being applied to said first transistor; and a second transistor of said first conduction type, said second transistor being inserted between an input terminal and a control electrode of said first transistor, and a control electrode of said second transistor being set at a voltage determined by subtracting twice the threshold voltage of said first and second transistors for said first power supply voltage or set at a voltage lower than the determined voltage.

23. A semiconductor memory as claimed in claim 22, wherein said first and second transistors of said first conduction type are determined to be P-channel type MOS transistors.

24. A semiconductor memory as claimed in claim 22, wherein said pre-word decoder further comprises:

a third transistor of a second conduction type opposite to said first conduction type, and a strong electric field caused by said second power supply voltage and said third power supply voltage being applied to said third transistor; and a fourth transistor of said second conduction type, said fourth transistor being inserted between an input terminal and a control electrode of said third transistor, and a control electrode of said fourth transistor being set at said first power supply voltage.

25. A semiconductor memory as claimed in claim 24, wherein said third and fourth transistors of said second conduction type are determined to be N-channel type MOS transistors.

26. A semiconductor memory as claimed in claim 22, wherein said first power supply voltage is a normal high power supply voltage, said second power supply voltage is a low power supply voltage, and said third power supply voltage is a super high power supply voltage higher than said normal high power supply voltage.

* * * * *